United States Patent
Hoffman et al.

(10) Patent No.: US 9,658,265 B2
(45) Date of Patent: May 23, 2017

(54) HIGH VOLTAGE DIGITAL VOLTMETER AND WIRELESS PHASER

(71) Applicant: HD Electric Company, Waukegan, IL (US)

(72) Inventors: Mark R. Hoffman, Lake Forest, IL (US); James S. Buchanan, Northbrook, IL (US); William John McNulty, Washington, DC (US)

(73) Assignee: HD ELECTRIC COMPANY, Waukegan, IL (US)

( * ) Notice: Subject to any disclaimer, the term of this patent is extended or adjusted under 35 U.S.C. 154(b) by 133 days.

(21) Appl. No.: 14/452,744

(22) Filed: Aug. 6, 2014

(65) Prior Publication Data

US 2016/0041208 A1     Feb. 11, 2016

(51) Int. Cl.
| | |
|---|---|
| *G01R 19/25* | (2006.01) |
| *G01R 25/00* | (2006.01) |
| *G01R 31/02* | (2006.01) |
| *G01R 19/00* | (2006.01) |
| G01R 1/04 | (2006.01) |
| G01R 1/067 | (2006.01) |

(52) U.S. Cl.
CPC ......... *G01R 25/00* (2013.01); *G01R 19/2503* (2013.01); *G01R 1/0416* (2013.01); *G01R 1/06788* (2013.01)

(58) Field of Classification Search
CPC .... G01R 25/00; G01R 29/18; G01R 19/2513; G01R 15/142; G01R 19/155; G01R 1/06777; G01R 15/14; G01R 31/3606; G01R 31/3648
See application file for complete search history.

(56) References Cited

U.S. PATENT DOCUMENTS

| | | | | |
|---|---|---|---|---|
| 4,071,824 | A * | 1/1978 | Kernander | H01F 38/20 324/127 |
| 5,057,770 | A * | 10/1991 | Kalishman | G01R 19/16561 324/149 |
| 6,734,658 | B1 * | 5/2004 | Bierer | G01R 15/14 324/107 |
| 6,998,832 | B1 * | 2/2006 | McNulty | G01R 19/155 324/457 |
| 7,746,051 | B1 * | 6/2010 | Buchanan | G01R 19/2503 324/114 |
| 9,121,877 | B2 * | 9/2015 | Cs | G01R 29/16 |
| 2014/0062512 | A1 * | 3/2014 | Kiing, Jr. | G01R 19/00 324/713 |

OTHER PUBLICATIONS

Fameca, Product Specification for TAG5500.
Fameca, TAG5500 Presentation, 22 pages.

* cited by examiner

*Primary Examiner* — Alesa Allgood
(74) *Attorney, Agent, or Firm* — Klintworth & Rozenblat IP LLC

(57) ABSTRACT

A high voltage digital voltmeter and wireless phaser includes first and second voltmeters/phasers. Each voltmeter/phaser has a probe for accessing a point in a circuit, circuitry connected to the probe and including a microprocessor, and a ground reference associated with the circuitry. Each microprocessor is programmed to measure line-to-ground voltage of the respective voltmeter/phaser. This information is shared between the microprocessors and is used to determine voltage measurements and phase angle difference.

10 Claims, 2 Drawing Sheets

HIGH VOLTAGE DIGITAL VOLTMETER AND WIRELESS PHASER

FIELD OF THE INVENTION

The present invention relates to a high voltage digital voltmeter and wireless phaser which is used to measure voltage and phase difference over widely separated points and for displaying the measured voltage value and phase difference value.

BACKGROUND OF THE INVENTION

A number of companies manufacture a variety of voltmeters, including high-voltage meters. The high-voltage meters may be of the type generally called hot-stick voltmeters or hot-stick voltmeters/phasers. Prior art hot stick voltmeters used on power distribution and transmission systems use encapsulated high voltage resistors, a meter display and a cord to connect either to ground or to a second resistor stick. Voltmeters with only one resistor stick have a cord to connect to earth ground and can measure voltage from any energized conductor referenced to ground. This is known as phase-to-ground or line-to-ground voltage. Voltmeters with two resistor sticks can measure phase-to-ground voltage if the second resistor stick is connected to ground, or the voltmeters can measure phase-to-phase voltage if each resistor stick is connected to a second energized phase. Voltmeters of both types are presently manufactured by HD Electric Company, with both analog and digital displays.

An example of a dual display voltmeter is shown in U.S. Pat. No. 7,746,051 which is owned by HD Electric Company. In a first embodiment of the '051 invention, the voltmeter/phaser has first and second probes for respectively accessing spaced-part points in a circuit, with a voltage measurement circuit proximate to the first probe. A cable including a first conductor connects the first and second probes to each other and to the measurement circuit. First and second voltage display circuits are respectively associated with the first and second probes, the first display circuit being connected directly to the measurement circuit. The cable includes a second conductor connected between the voltage display circuits for conducting a display data signal from the first display circuit to the second display circuit to ensure that both display circuits display the same voltage value. In another embodiment of '051 invention, a voltmeter/phaser has first and second high-voltage probes for respectively accessing spaced-apart points in a high-voltage circuit, with a high-voltage measurement circuit proximate to one of the probes. A cable connects the first and second probes to each other and to the measurement circuit. First and second high-voltage display circuits are respectively associated with the first and second probes and are coupled to the measurement circuit. In the '051 invention, voltmeter/phaser measures and displays a voltage between spaced-apart points in a circuit. This is accomplished by electrically contacting the points respectively with first and second probes and providing a plural-conductor cable between the probes. The method further includes conducting a current between the probes through a first conductor of the cable, measuring the current and displaying an equivalent measured voltage value on the first display. A signal representative of the displayed value is conducted through a second conductor of the cable to a remote display at the second probe so that both displays show the same value.

With the '051 invention, the voltage displayed is by definition the voltage difference between the two phases. This display is inherently limited to the voltage magnitude difference and cannot measure the phase angle difference and display the phase-to-phase voltage. In addition, with the '051 invention, since the sticks are corded, and typical cord lengths are in the range of 15 to 25 feet, the cord limits the distance between which voltage measurements may be made.

A high voltage digital voltmeter and wireless phaser is provided herein which provides improvements to the existing prior art and which overcomes the disadvantages presented by the prior art. Other features and advantages will become apparent upon a reading of the attached specification, in combination with a study of the drawings.

SUMMARY OF THE INVENTION

A high voltage digital voltmeter and wireless phaser includes first and second voltmeters/phasers. Each voltmeter/phaser has a probe for accessing a point in a circuit, circuitry connected to the probe and including a microprocessor, and a ground reference associated with the circuitry. Each microprocessor is programmed to measure line-to-ground voltage of the respective voltmeter/phaser. This information is shared between the microprocessors and is used to determine voltage measurements and phase angle difference.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DETAILED DESCRIPTION OF THE ILLUSTRATED EMBODIMENTS

Figure 1:
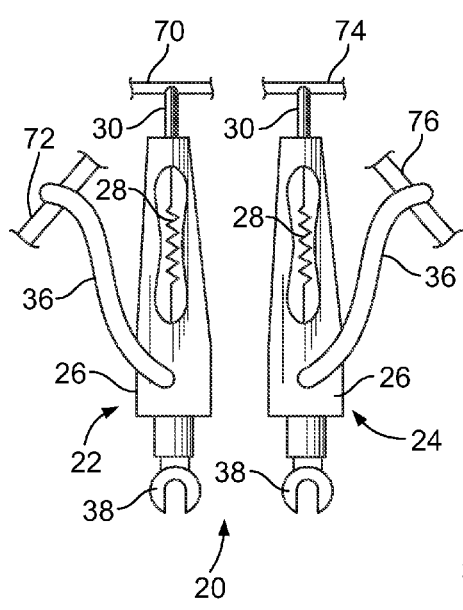
FIG. 1 is a front elevation view of a voltmeter/phaser in accordance with a first embodiment of the present invention, with portions broken away to show interior construction.

While the invention may be susceptible to embodiment in different forms, there is shown in the drawings, and herein will be described in detail, specific embodiments with the understanding that the present disclosure is to be considered an exemplification of the principles of the invention, and is not intended to limit the invention to that as illustrated and described herein. Therefore, unless otherwise noted, features disclosed herein may be combined together to form additional combinations that were not otherwise shown for purposes of brevity.

A high voltage digital voltmeter and wireless phaser 20, 120 is used to measure voltage and phase difference over widely separated points along a power line, and is used to display for an operator the measured voltage value of the lines of the power lines and the phase difference value. The high voltage digital voltmeter and wireless phaser 20, 120 has particular application to high-voltage circuits, such as power line transmission and distribution circuits, but the principles may also be applied in low voltage circuits.

Figure 3:
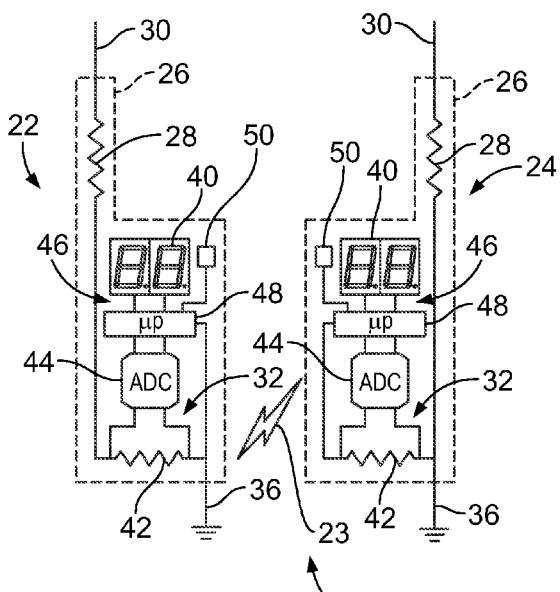
FIG. 3 is a partially schematic and partially functional block diagrammatic view of the circuitry of the voltmeter/phaser of FIG. 1.
Figure 2:
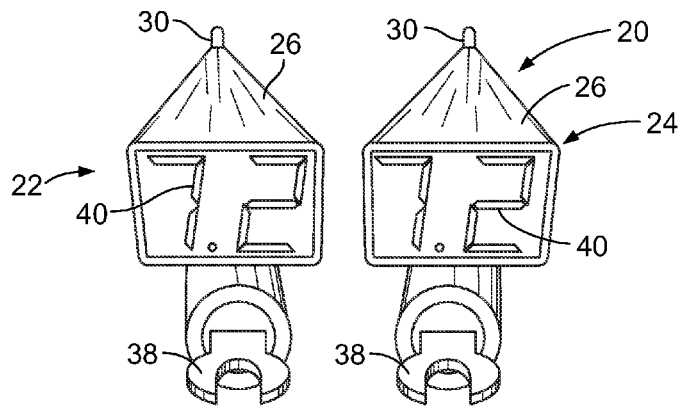
FIG. 2 is an end perspective view of the voltmeter/phaser of FIG. 1 illustrating the digital displays.
Figure 4:
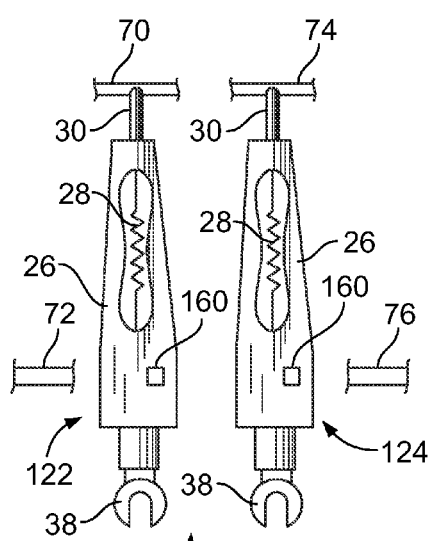
FIG. 4 is a front elevation view of a voltmeter/phaser in accordance with a second embodiment of the present invention, with portions broken away to show interior construction.
Figure 6:
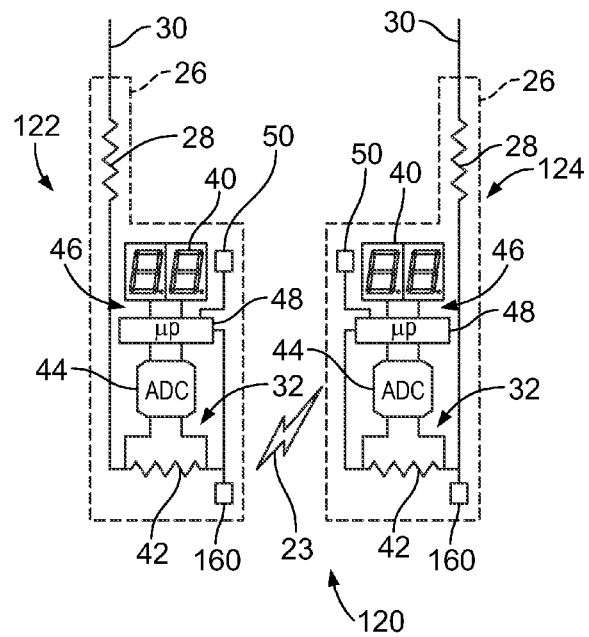
FIG. 6 is a partially schematic and partially functional block diagrammatic view of the circuitry of the voltmeter/phaser of FIG. 1.
Figure 5:
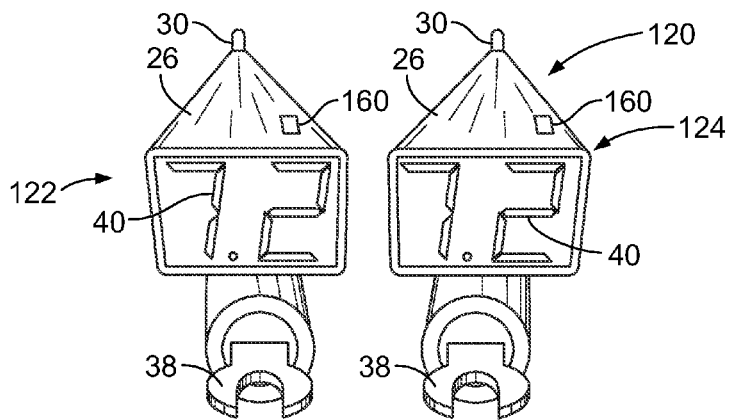
FIG. 5 is an end perspective view of the voltmeter/phaser of FIG. 3 illustrating the digital displays.

A first embodiment of the high voltage digital voltmeter and wireless phaser 20 is shown in FIGS. 1-3. A second embodiment of the high voltage digital voltmeter and wireless phaser 120 is shown in FIGS. 4-6. The high voltage digital voltmeter and wireless phaser 20, 120 of each embodiment includes a first voltmeter/phaser 22, 122 and a second voltmeter/phaser 24, 124, each of which uses a ground reference for determining voltage and phase difference. The first and second voltmeters/phasers 22, 24, 122, 124 are in wireless communication with each other via a wireless link 23, and display shared information between the voltmeter/phasers 22, 24, 122, 124 regarding voltage levels and phase angle difference. Since the high voltage digital voltmeter and wireless phaser 20, 120 uses a wireless link 23, the components of the voltage digital voltmeter and wireless phaser 20, 120 can be spaced apart from each other a length which is greater than a reasonable length of a cord, for example greater than 15 to 25 feet apart from each other. Since each high voltage digital voltmeter and wireless phaser 20, 120 uses a ground reference, the accuracy of the voltage measurement is increased over prior art devices, and the high voltage digital voltmeter and wireless phaser 20, 120 can determine the phase angle difference between lines in adjacent sets of lines.

The display of the voltage provides the operator with information regarding the voltage levels read by the voltmeter/phasers 22, 24, 122, 124 and calculates the voltage between the voltmeter/phasers 22, 24, 122, 124 (voltages combined with phase angle) and helps to confirm the network identification. The display of the phase-to-phase voltage provides the operator with information to help the operator determine with accuracy the reason of an "out of phase indication". The combination of these functions gives the operator the information necessary to close a circuit in the most appropriate way in compliance with related regulation.

Attention is invited to the first embodiment of the high voltage digital voltmeter and wireless phaser 20 shown in FIGS. 1-3. Each voltmeter/phaser 22, 24 includes a housing 26 which encloses a high-voltage resistor 28 that is encapsulated and supported within the housing 26 by suitable encapsulation material (not shown), a probe 30 which is electrically connected to the high-voltage resistor 28 and extends from the housing 26, circuitry 32 provided in the housing 26 for determining voltage and phase difference, and a flexible ground cord 36 extending from the housing 26 and connected to the circuitry 32 to provide the ground reference. The probe 30 is suitably mechanically connected to the housing 26 in a known manner. Each probe 30 is electrically conducting and is adapted to make electrical contact with a point in a circuit under test. Each ground cord 36 is electrically conducting and is adapted to make electrical contact with earth ground. Each housing 26 has a mechanical connection 38 at the end opposite to the resistor 28 which is adapted for mechanical connection to an extension hot stick (not shown) to both extend the reach of the operator using the voltmeter/phaser 22, 24 and to provide additional insulation between the operator and the circuit under test, all in a known manner. A display 40 is provided in the housing 26 and is connected to the circuitry 32. The display 40 is preferably digital, may be video and may be analog.

Referring to FIG. 3, the circuitry 32 in each voltmeter/phaser 22, 24 includes a shunt resistor 42 connected to the ground cord 36 and thus to earth ground when the ground cord 36 is grounded, an analog-to-digital converter ("ADC") 44 connected across the shunt resistor 42, a display circuit 46 which includes a microprocessor 48 which drive the respective display 40. The microprocessor 48 is connected to the output of the ADC 44. A transceiver 50 is provided in the housing 26 and is in communication with the microprocessor 48. The transceiver 50 is used to wirelessly communicate information between the voltmeters/phasers 22, 24 and to wirelessly receive information via the wireless link 23.

During use, a first operator uses the first voltmeter/phaser 22 and places its probe 30 in direct contact with one high-voltage conductor 70 in a first set of lines, and places its ground cord 36 in direct contact with a grounded conductor 72; and a second operator uses the second voltmeter/phaser 22 and places its probe 30 in direct contact with one high-voltage conductor 74 in a second set of lines, and places its ground cord 36 in direct contact with a grounded conductor 76. Each microprocessor 48 is programmed to measure the line-to-ground voltage via the ground cord 36 connected to the grounded conductor 72, 74 for the respective voltmeter/phase 22, 24. In each voltmeter/phase 22, 24, the encapsulated resistors 28 limit the current drawn from the high-voltage circuit to a very low value, typically less than 1 ma. In each voltmeter/phaser 22, 24, this current through the shunt resistor 42, which is a small resistor, results in only a few volts. Because the shunt resistor 42 is subject to only a few volts, a special high-voltage resistor is not needed, nor does it need to be encapsulated. In general, any typical low power resistor will fulfill this function. In each voltmeter/phase 22, 24, the low voltage across the shunt resistor 42 is converted to a digital signal by the ADC 44, which sends the resulting digital signal indicating the voltage of the line to the microprocessor 48 in the respective voltmeter/phaser 22, 24.

In each voltmeter/phase 22, 24, the microprocessor 48 converts the digital signal received from the ADC 44 to a form suitable for driving the display digits of the respective display 40. If desired, each microprocessor 48 may be programmed to display the line voltage of the respective voltmeter/phaser 22, 24 on the respective display 40.

The microprocessor 48 of the first voltmeter/phaser 22 sends the digital voltage signal via the wireless link 23 via the transceivers 50, and such wireless communications may be accomplished in a known manner, such as by Bluetooth or Wi-Fi, to the microprocessor 48 of the second voltmeter/phaser 24. The microprocessor 48 of the second voltmeter/phaser 24 is programmed to compare its measured voltage with the voltage received from the first voltmeter/phaser 22, and is programmed to derive information regarding line-to-line voltage between the two voltmeters/phasers 22, 24. The microprocessor 48 of the second voltmeter/phaser 24 is programmed to send this derived information to the microprocessor 48 of the first voltmeter/phaser 24 via the wireless link 23, and both microprocessors 48 are programmed to display this derived information on its display 40. Therefore, both operators have the same information virtually simultaneously. The microprocessor 46 may also provide additional functions, such as scaling the voltage reading to provide varying levels of resolution as the magnitude of the voltage changes. The voltage signal provides the same voltage value to both displays 40. Thus, the same number will appear on both displays 40 nearly simultaneously.

Each microprocessor 48 is programmed to detect when the voltage crosses zero ("zero crossing"). When the microprocessor 48 of the first voltmeter/phaser 22 detects the zero crossing, this information is communicated to the microprocessor 48 of the second voltmeter/phaser 24. This information is transmitted wirelessly via the transceivers 50, and such wireless communications may be accomplished in a known manner, such as by Bluetooth or Wi-Fi. The microprocessor 48 of the second voltmeter/phaser 24 is programmed to derive information regarding the phase-to-phase voltage and the phase angle difference, if any, between the zero crossing signals. The phase angle difference is derived by the microprocessor 48 of the second voltmeter/phaser 24 by determining the time difference between the zero crossings in the lines. The microprocessor 48 of the second voltmeter/phaser 24 is programmed to send this derived information via the wireless link 23 to the microprocessor 48 of the first voltmeter/phaser 24, and both microprocessors 48 are programmed to display this derived information on its display 40. This same phase-to-ground or phase-to-phase voltage is displayed on the displays 40 of both voltmeters/phasers 22, 24. Therefore, both operators have the same information virtually simultaneously. The displays 40 on both voltmeters/phasers 22, 24 include annunciators to indicate whether phase-to-ground or phase-to-phase voltage is being displayed, the status of the wireless link 23, battery condition and other information useful to the operator.

As discussed, the voltmeters/phasers 22, 24 are communicatively connected together by the wireless link 23. Such wireless communications may be accomplished in a known manner, such as by Bluetooth or Wi-Fi. The wireless link 23 allows the two voltmeters/phasers 22, 24 to share data on their respective phase-to-ground voltage measurements, specifically the voltage magnitude and phase, as that both voltmeters/phasers 22, 24 display the shared data. The operators of the voltmeters/phasers 22, 24 use the shared data for properly connecting the lines together.

Attention is invited to the second embodiment of the high voltage digital voltmeter and wireless phaser 120 shown in FIGS. 4-6. The second embodiment of the high voltage digital voltmeter and wireless phaser 120 is identical in structure and function to the first embodiment of the high voltage digital voltmeter and wireless phaser 20, except that a small electrically conducting electrode 160 is used to measure the electric field strength to approximate earth ground, e.g., instead of providing the ground cord 36 of the first embodiment of the high voltage digital voltmeter and wireless phaser 20. As such, like elements are denoted with like reference numbers. The electrode 160 on each voltmeter/phaser 122, 124 is connected to the circuitry 32 and may be provided as part of the metal housing 34. Referring to FIG. 5, in each voltmeter/phaser 122, 124, the shunt resistor 42 is connected to the electrode 160.

During use, a first operator uses the first voltmeter/phaser 122 and places its probe 30 in direct contact with one high-voltage conductor 70 in a first set of lines. The electrode 160 of the first voltmeter/phaser 122 is in proximity to, but does not directly contact, a grounded conductor 72 such that the field strength can be measured by the microprocessor 48 of the first voltmeter/phaser 122. A second operator uses the second voltmeter/phaser 122 and places its probe 30 in direct contact with one high-voltage conductor 74 in a second set of lines. The electrode 160 of the first voltmeter/phaser 122 is in proximity to, but does not directly contact, a grounded conductor 76 such that the field strength can be measured by the microprocessor 48 of the second voltmeter/phaser 124. Each microprocessor 48 is programmed to measure the line-to-ground voltage using the field strength information from the electrode 160 for the respective voltmeter/phase 122, 124. As described with respect to the first embodiment, the low voltage across the shunt resistor 42 is converted to a digital signal by the ADC 44 in each voltmeter/phase 122, 124, which sends the resulting digital signal indicating the voltage of the line to the microprocessor 48 in the respective voltmeter/phase 122, 124.

In each voltmeter/phase 122, 124, the microprocessor 48 converts the digital signal received from the ADC 44 to a form suitable for driving the display digits of the respective display 40. If desired, each microprocessor 48 may be programmed to display the line voltage of the respective voltmeter/phaser 122, 124 on the respective display 40.

The microprocessor 48 of the first voltmeter/phaser 122 sends the digital voltage signal via the wireless link 23 via the transceivers 50, and such wireless communications may be accomplished in a known manner, such as by Bluetooth or Wi-Fi, to the microprocessor 48 of the second voltmeter/phaser 124. The microprocessor 48 of the second voltmeter/phaser 124 is programmed to compare its measured voltage with the voltage received from the first voltmeter/phaser 122, and is programmed to derive information regarding line-to-line voltage between the two voltmeters/phasers 122, 124. The microprocessor 48 of the second voltmeter/phaser 124 is programmed to send this derived information to the microprocessor 48 of the first voltmeter/phaser 124 via the wireless link 23, and both microprocessors 48 are programmed to display this derived information on its display 40. Therefore, both operators have the same information virtually simultaneously. The microprocessor 46 may also provide additional functions, such as scaling the voltage reading to provide varying levels of resolution as the magnitude of the voltage changes. The voltage signal provides the same voltage value to both displays 40. Thus, the same number will appear on both displays 40 nearly simultaneously.

Each microprocessor 48 is programmed to detect when the voltage crosses zero ("zero crossing"). When the microprocessor 48 of the first voltmeter/phaser 122 detects the zero crossing, this information is communicated to the microprocessor 48 of the second voltmeter/phaser 124. This information is transmitted wirelessly via the transceivers 50, and such wireless communications may be accomplished in a known manner, such as by Bluetooth or Wi-Fi. The microprocessor 48 of the second voltmeter/phaser 124 is programmed to derive information regarding the phase-to-phase voltage and the phase angle difference, if any, between the zero crossing signals. The phase angle difference is derived by the microprocessor 48 of the second voltmeter/phaser 124 by determining the time difference between the zero crossings in the lines. The microprocessor 48 of the second voltmeter/phaser 124 is programmed to send this derived information via the wireless link 23 to the microprocessor 48 of the first voltmeter/phaser 124, and both microprocessors 48 are programmed to display this derived information on its display 40. This same phase-to-ground or phase-to-phase voltage are displayed on the displays 40 of both voltmeters/phasers 122, 124. Therefore, both operators have the same information virtually simultaneously. The displays 40 on both voltmeters/phasers 122, 124 include annunciators to indicate whether phase-to-ground or phaseto-phase voltage is being displayed, the status of the wireless link 23, battery condition and other information useful to the operator.

As discussed, the voltmeters/phasers 122, 124 are communicatively connected together by the wireless link 23. Such wireless communications may be accomplished in a known manner, such as by Bluetooth or Wi-Fi. The wireless link 23 allows the two voltmeters/phasers 122, 124 to share data on their respective phase-to-ground voltage measurements, specifically the voltage magnitude and phase, as that both voltmeters/phasers 122, 124 display the shared data. The operators of the voltmeters/phasers 122, 124 use the shared data for properly connecting the lines together.

In this second embodiment of the high voltage digital voltmeter and wireless phaser 120, since the voltage measurement is made by approximating earth ground by measuring electric field strength (instead of directly measuring earth ground from a direct connection to ground), some degree of accuracy is sacrificed. However, because a direct connection is not used, this eliminates a step required for use in with the first embodiment.

Since the voltmeters/phasers 22, 24, 122, 124 wirelessly communicate with each other, the voltmeters/phasers 22, 24, 122, 124 can be spaced a great distance apart (farther apart than a reasonable cord length, for example greater than 15 to 25 feet) from each other, such that the voltmeters/phasers 22, 24, 122, 124 do not need to be in close proximity to each other. This eliminates the cord of the prior art. Since the voltmeters/phasers 22, 24, 122, 124 use a ground reference and each measures earth ground, the accuracy of the voltage measurement is increased over prior art devices, and the high voltage digital voltmeter and wireless phaser 20, 120 can determine the phase angle difference between lines in adjacent sets of lines.

While a particular circuit configuration is illustrated, it will be appreciated that, as with most electronic devices, other circuit topologies could provide the desired functions of measuring, displaying, sending, receiving and redisplaying the voltage reading.

While preferred embodiments of the present invention are shown and described, it is envisioned that those skilled in the art may devise various modifications of the present invention without departing from the spirit and scope of the appended claims.

What is claimed is:

1. A voltmeter and wireless phaser comprising:
a first voltmeter/phaser having a first probe configured to access a first point in a circuit, first circuitry connected to the first probe, a ground reference associated with the first circuitry, and a first display in communication with the first circuitry and upon which information is displayable; and
a second voltmeter/phaser having a second probe configured to access a second point in the circuit which is spaced apart from the first point, second circuitry connected to the second probe, a ground reference associated with the second circuitry, and a second display in communication with the second circuitry and upon which information is displayable;
wherein the first circuitry is configured to measure line-to-ground voltage of the first voltmeter/phaser and to communicate the measured line-to-ground voltage of the first voltmeter/phaser to the second circuitry; and
the second circuitry is configured to:

measure line-to-ground voltage of the second voltmeter/phaser and to receive the measured line-to-ground voltage from the first voltmeter/phaser,
compare the measured line-to-ground voltage of the second voltmeter/phaser with the line-to-ground voltage received from the first voltmeter/phaser to determine a line-to-line voltage between the first and second voltmeters/phasers, and
output information regarding the determined line-to-line voltage of the first and second voltmeters/phasers; and
wherein the first and second displays are configured to concurrently display the information regarding the determined line-to-line voltage of the first and second voltmeters/phasers.

2. The voltmeter and wireless phaser of claim 1, wherein the ground reference associated with said first circuitry is provided by a first ground cord which, in use, is directly connected to a ground conductor, and the ground reference associated with said second circuitry is provided by a second ground cord which, in use, is directly connected to a ground conductor.

3. The voltmeter and wireless phaser of claim 1, wherein the ground reference associated with said first circuitry is provided by a first electrode which measures electric field strength, and the ground reference associated with said second circuitry is provided by a second electrode which measures electric field strength.

4. The voltmeter and wireless phaser of claim 1, wherein said first voltmeter/phaser further comprising a first high-voltage resistor connected between the first probe and the first circuitry, and a first insulating housing enclosing the first high-voltage resistor and carrying the first probe; and wherein said second voltmeter/phaser further comprises a second high-voltage resistor connected between the second probe and the second circuitry, and a second insulating housing enclosing the second high-voltage resistor and carrying the second probe.

5. The voltmeter and wireless phaser of claim 4, wherein said first voltmeter/phaser further comprises a first shunt resistor connected with the first probe and a first analog-to-digital converter connected across the first shunt resistor; and wherein said second voltmeter/phaser further comprises a second shunt resistor connected with the second probe and a second analog-to-digital converter connected across the second shunt resistor.

6. The voltmeter and wireless phaser of claim 1, wherein the second circuitry is configured to calculate a phase angle difference between said first point in the circuit and the second point in the circuit.

7. The voltmeter and wireless phaser of claim 6, wherein the first and second displays are configured to concurrently display information regarding phase-to-ground voltage or phase-to-phase voltage of each of the first and second voltmeters/phasers.

8. The voltmeter and wireless phaser of claim 6, wherein information is communicated between the first and second voltmeters/phasers via a wireless link.

9. The voltmeter and wireless phaser of claim 1, wherein information is communicated between the first and second voltmeters/phasers via a wireless link.

10. The voltmeter and wireless phaser of claim 9, wherein the wireless link is provided by Bluetooth or Wi-Fi.

* * * * *

UNITED STATES PATENT AND TRADEMARK OFFICE
CERTIFICATE OF CORRECTION

PATENT NO. : 9,658,265 B2
APPLICATION NO. : 14/452744
DATED : May 23, 2017
INVENTOR(S) : Hoffman et al.

It is certified that error appears in the above-identified patent and that said Letters Patent is hereby corrected as shown below:

In Column 4, Lines 21-22, delete "second voltmeter/phaser 22" and insert -- second voltmeter/phaser 24 --, therefor.

In Column 4, Line 28, delete "voltmeter/phase 22, 24. In each voltmeter/phase" and insert -- voltmeter/phaser 22, 24. In each voltmeter/phaser --, therefor.

In Column 4, Line 37, delete "voltmeter/phase" and insert -- voltmeter/phaser --, therefor.

In Column 4, Line 42, delete "voltmeter/phase" and insert -- voltmeter/phaser --, therefor.

In Column 4, Line 60, delete "first voltmeter/phaser 24" and insert -- first voltmeter/phaser 22 --, therefor.

In Column 4, Line 64, delete "microprocessor 46" and insert -- microprocessor 48 --, therefor.

In Column 5, Line 4, delete "crossing)." and insert -- crossing"). --, therefor.

In Column 5, Line 20, delete "first voltmeter/phaser 24," and insert -- first voltmeter/phaser 22, --, therefor.

In Column 5, Line 64, delete "second voltmeter/phaser 122" and insert -- second voltmeter/phaser 124 --, therefor.

In Column 6, Lines 5-6, delete "voltmeter/phase" and insert -- voltmeter/phaser --, therefor.

In Column 6, Lines 8-9, delete "voltmeter/phase" and insert -- voltmeter/phaser --, therefor.

In Column 6, Line 12, delete "voltmeter/phase" and insert -- voltmeter/phaser --, therefor.

Signed and Sealed this
Twenty-fourth Day of April, 2018

Andrei Iancu
*Director of the United States Patent and Trademark Office*

CERTIFICATE OF CORRECTION (continued)
U.S. Pat. No. 9,658,265 B2

In Column 6, Line 31, delete "first voltmeter/phaser 124" and insert -- first voltmeter/phaser 122 --, therefor.

In Column 6, Line 35, delete "microprocessor 46" and insert -- microprocessor 48 --, therefor.

In Column 6, Line 44, delete "crossing)." and insert -- crossing"). --, therefor.

In Column 6, Line 60, delete "first voltmeter/phaser 124," and insert -- first voltmeter/phaser 122, --, therefor.